United States Patent
Maeng et al.

(10) Patent No.: US 7,169,707 B2
(45) Date of Patent: Jan. 30, 2007

(54) METHOD OF MANUFACTURING PACKAGE SUBSTRATE WITH FINE CIRCUIT PATTERN USING ANODIC OXIDATION

(75) Inventors: Duck Young Maeng, Chungcheongbuk-do (KR); Byung Kook Sun, Seoul (KR); Tae Hoon Kim, Daejeon (KR); Jee Soo Mok, Chungcheongbuk-do (KR); Jong Suk Bae, Busan (KR); Yoong Oh, Chungcheongnam-do (KR); Chang-Kyu Song, Daejeon (KR); Suk-Hyeon Cho, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 275 days.

(21) Appl. No.: 11/011,401

(22) Filed: Dec. 13, 2004

(65) Prior Publication Data
US 2006/0046485 A1 Mar. 2, 2006

(30) Foreign Application Priority Data
Aug. 24, 2004 (KR) .................... 10-2004-0066799

(51) Int. Cl.
*H01L 21/302* (2006.01)

(52) U.S. Cl. .................... 438/689; 438/719; 361/764; 427/383.7; 427/405

(58) Field of Classification Search ............... 438/689, 438/719; 361/764; 427/383.7, 405
See application file for complete search history.

(56) References Cited

U.S. PATENT DOCUMENTS

| | | | |
|---|---|---|---|
| 6,300,686 B1 * | 10/2001 | Hirano et al. ............... | 257/783 |
| 6,486,006 B2 * | 11/2002 | Hirano et al. ............... | 438/125 |
| 6,620,731 B1 * | 9/2003 | Farnworth et al. .......... | 438/667 |
| 2004/0113244 A1 * | 6/2004 | Shin et al. .................. | 257/678 |

OTHER PUBLICATIONS

Korean Publication No. 1020030073919 A published Sep. 19, 2003.

* cited by examiner

*Primary Examiner*—Nadine Norton
*Assistant Examiner*—Lynette T. Umez-Eronini
(74) *Attorney, Agent, or Firm*—Darby & Darby

(57) ABSTRACT

Disclosed herein is a method of manufacturing a package substrate with a fine circuit pattern using anodic oxidation. By anodizing a metal core which is opened through a masking process, oxidation layers are formed in open areas of the metal core to insulate portions of circuit pattern from each other. Further, by electroplating portions provided between the oxidation layers with copper or filling conductive paste between the oxidation layers using a screen, a package substrate having a fine circuit pattern is achieved.

33 Claims, 15 Drawing Sheets

METHOD OF MANUFACTURING PACKAGE SUBSTRATE WITH FINE CIRCUIT PATTERN USING ANODIC OXIDATION

INCORPORATION BY REFERENCE

The present application claims priority under 35 U.S.C. §119 to Korean Patent Application No. 2004-66799 filed on Aug. 24, 2004. The content of the application is incorporated herein by reference in its entirety.

BACKGROUND OF THE INVENTION

1. Field of the Invention

The present invention relates generally to a method of manufacturing a package substrate with a fine circuit pattern using anodic oxidation. More particularly, the present invention relates to a method of manufacturing a package substrate with a fine circuit pattern, which is achieved by forming open areas on a metal core through a masking process, and forming oxidation layers on the open areas through anodic oxidation, and electro-copper plating portions between the oxidation layers or filling paste between the oxidation layers.

2. Description of the Related Art

Generally, printed circuit boards (PCBs) are manufactured through the following processes. That is, a thin film made of copper or the like is attached to a surface of an insulation plate made of a phenol or epoxy resin. Next, the insulation plate with the thin film is etched according to a wiring pattern of a circuit such that parts other than the circuit are eliminated, so that a required circuit is obtained. Afterwards, holes are bored for mounting components.

That is, the PCB functions to electrically interconnect the components mounted according to the wiring pattern. Further, the PCB serves to supply electricity to the components and mechanically support the components.

Recently, as miniaturization and thinness of the PCB are increasingly required in various fields including industrial equipment, office equipment, communication equipment, broadcasting equipment, and portable computers, especially, mobile communication equipment and digital household electric appliances, packaging technology, such as micro ball grid array (BGA), tape carrier package (TCP), and chip size package (CSP), has been developed. Thus, those skilled in the art take a growing interest in a method of manufacturing the package substrate on which a chip is mounted, using the above-mentioned packaging technology.

The method of manufacturing a package substrate through a conventional build-up method will be described in detail with reference to FIGS. 1a to 1k.

In this case, the build-up method is defined as a method wherein an inner layer with a circuit pattern is formed, and outer layers are laid on the inner layer one by one.

First, as shown in FIG. 1a, an insulation layer 11 is provided, and copper foil layers 12 are placed on both surfaces of the insulation layer 11 so that the insulation layer 11 is interposed between the copper foil layers 12. Thereby, a copper clad laminate 10 is prepared.

The copper clad laminate 10 is a substrate for fabricating a PCB, and is configured such that copper 12 is thinly coated on both surfaces of the insulation layer 11. A glass/epoxy copper clad laminate is used as the copper clad laminate 10.

Next, as shown in FIG. 1b, a via hole 13 is formed on the copper clad laminate 10 through a drilling process. The via hole 13 functions to electrically connect several layers to each other. Subsequently, electroless copper plating or electrolytic copper plating is carried out to form a plating layer 14 on the copper foil layers 12 and the via hole 13, as shown in FIG. 1c.

After the electroless copper plating or electrolytic copper plating is carried out, paste 20 is filled in the via hole 13 to protect the plating layer 14 which is formed on an inside wall of the via hole 13, as shown in FIG. 1d.

In this case, insulating ink material is usually used as the paste 20. However, conductive paste may be used according to an intended purpose of a PCB.

After the paste 20 is filled in the via hole 13, an etching resist pattern 30 is formed so as to form an inner layer circuit pattern on the plating layer 14 of the copper clad laminate 10, as shown in FIG. 1e.

In order to form the etching resist pattern 30, a circuit pattern printed on an artwork film must be transferred to the copper clad laminate 10. To date, several transferring methods have been used. However, a transferring method using a photoresist dry film is the most widely used. According to this method, the circuit pattern printed on the artwork film is transferred to the dry film by ultraviolet rays.

In this case, the dry film to which the circuit pattern is transferred serves as an etching resist. Thus, when the etching process is carried out, a portion of the plating layer 14 without the etching resist pattern 30 is eliminated. Thereby, a base substrate with a predetermined inner layer circuit pattern 15 is obtained, as shown in FIG. 1f.

Thereafter, in order to form a predetermined build-up layer on the base substrate with the inner layer circuit pattern 15, a resin layer 40 is laminated to provide an interlayer electrical insulation, as shown in FIG. 1g. Subsequently, as shown in FIG. 1h, a blind via hole 50 is formed on the resin layer 40 to electrically connect the inner layer circuit pattern 15 formed on the base substrate and an outer layer circuit pattern which will be described later.

In this case, the blind via hole 50 may be formed through a mechanical drilling method. However, since the blind via hole 50 must be more precisely machined compared to a through hole, it is preferable that the blind via hole 50 be formed using a yttrium aluminum garnet (YAG) laser or $CO_2$ laser.

After the blind via hole 50 is formed, the blind via hole 50 is plated with copper. Simultaneously, a plating layer 60 on which a predetermined outer layer circuit pattern is formed is provided, as shown in FIG. 1i.

Thereafter, a masking process is carried out to form an outer layer circuit pattern on the plating layer 60, as shown in FIG. 1j. Finally, photo imageable solder resist mask (PSR) ink 70 is coated as shown in FIG. 1k, thus protecting the outer layer circuit pattern 61 formed on the plating layer 60, and preventing the formation of a solder bridge on the outer layer circuit pattern 61, during a soldering process. Accordingly, a final package board is completed.

As described above, the method of manufacturing the package substrate using a semi-additive method wherein the copper clad laminate 10 is used as a core layer and the build-up layers are laid on upper and lower surfaces of the copper clad laminate 10, has the following problems. That is, since the copper clad laminate 10 is used, the thickness of the package substrate is inevitably increased, and thereby it is impossible to comply with requirements for an increase in signal processing speed and package density and miniaturization of a system, and it is difficult to realize system-in-package.

Further, the conventional method of manufacturing the package substrate according to Korean Laid-Open Publication No. 2003-73919 has the following problems. That is, since electrolytic copper is laid on a seed layer through electroless plating, and then a fine circuit is formed using the dry film, it is impossible to achieve a fine circuit pattern of 50 micrometers or less. Further, as the fineness of the circuit pattern becomes higher, delamination of the dry film frequently occurs, thus causing a defective product.

SUMMARY OF THE INVENTION

Accordingly, the present invention has been made keeping in mind the above problems occurring in the prior art, and an object of the present invention is to provide a method of manufacturing a package substrate with a fine circuit pattern, which is achieved by forming oxidation layers on open areas of a metal core through anodic oxidation, and electro-copper plating portions between the oxidation layers or filling paste between the oxidation layers.

In order to accomplish the above object, the present invention provides a method of manufacturing a package substrate, including forming open areas on a surface of a metal core through a masking process; growing oxidation layers through the open areas by anodizing the metal core; forming a fine circuit pattern by forming conductive layers between the oxidation layers provided on the surface of the metal core; forming a resin layer on the surface of the metal core with the fine circuit pattern; and selectively etching an opposite surface of the metal core.

Further, the present invention provides a method of manufacturing a package substrate, including forming open areas on a surface of a metal core through a masking process; growing oxidation layers through the open areas by anodizing the metal core; forming a fine circuit pattern by forming conductive layers between the oxidation layers provided on the surface of the metal core; selectively etching the oxidation layers through a masking process; forming a resin layer on the surface of the metal core with the fine circuit pattern; and selectively etching an opposite surface of the metal core, thus providing a base substrate for packaging.

Furthermore, the present invention provides a method of manufacturing a package substrate, including forming open areas on a surface of a metal core through a masking process; growing oxidation layers through the open areas by anodizing the metal core; forming a resin layer on the surface of the metal core with the oxidation layers; selectively etching an opposite surface of the metal core; selectively etching the oxidation layers through a masking process; and forming conductive layers in portions left after selectively etching the oxidation layers, thus providing a base substrate for packaging with a fine circuit pattern.

The present invention provides a method of manufacturing a package substrate, including forming open areas on a surface of a metal core through a masking process; growing oxidation layers through the open areas by anodizing the metal core; forming a fine circuit pattern by forming conductive layers between the oxidation layers provided on the surface of the metal core; forming plating posts on the surface of the metal core with the circuit pattern, the plating posts providing an interlayer electrical connection; forming a resin layer on the surface of the metal core with the plating posts; selectively etching an opposite surface of the metal core, thus providing a base substrate for packaging; and laminating and compressing several base substrates, thus providing a multi-layer base substrate for packaging.

In this case, the present invention may further include selectively etching the oxidation layers through a masking process, after forming the plating posts.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a method of manufacturing a package substrate with a fine circuit pattern using anodic oxidation, according to the present invention will be described in detail with reference to the accompanying drawings.

A method of manufacturing a package substrate with a fine circuit pattern using anodic oxidation, according to the first embodiment of this invention, will be described with reference to FIGS. 2a to 2k.

Figure 1A:
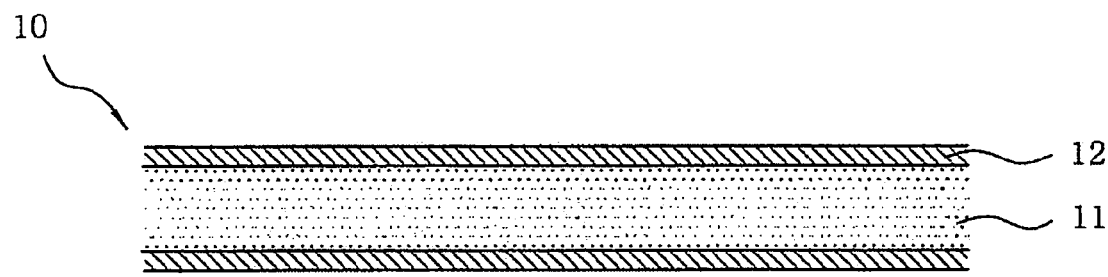
FIG. 1a to 1k are views to show a process of manufacturing a package substrate through a conventional build-up method.
Figure 1B:
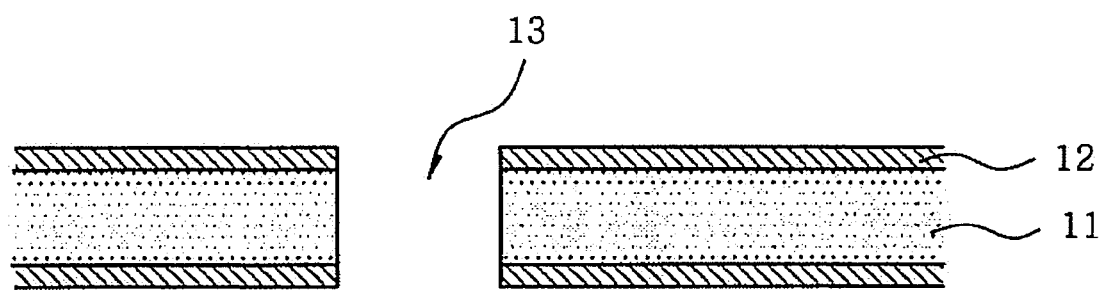
Figure 1C:
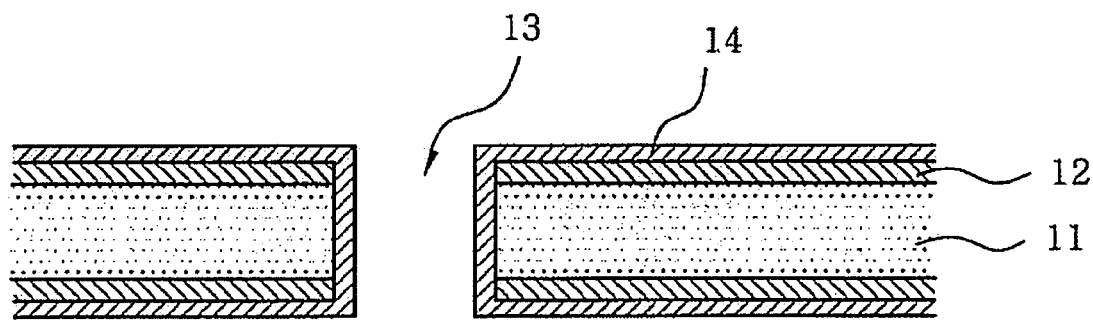
Figure 1D:
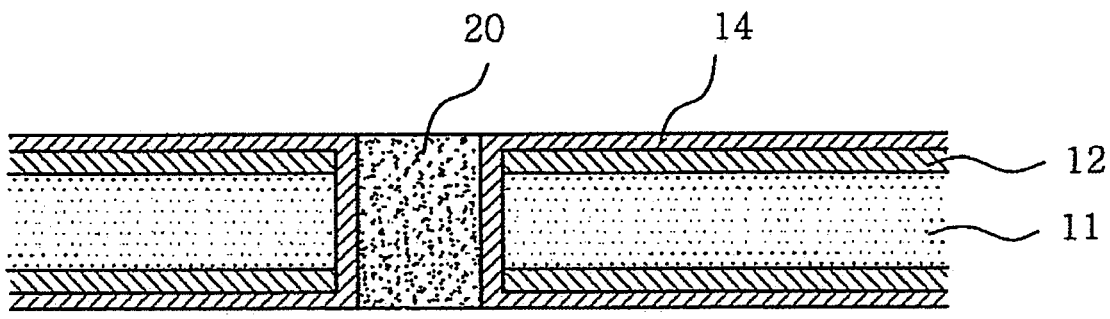
Figure 1E:
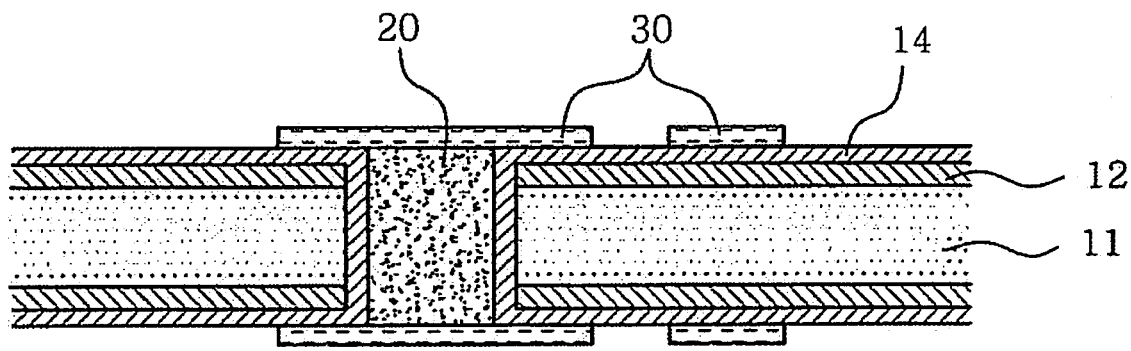
Figure 1F:
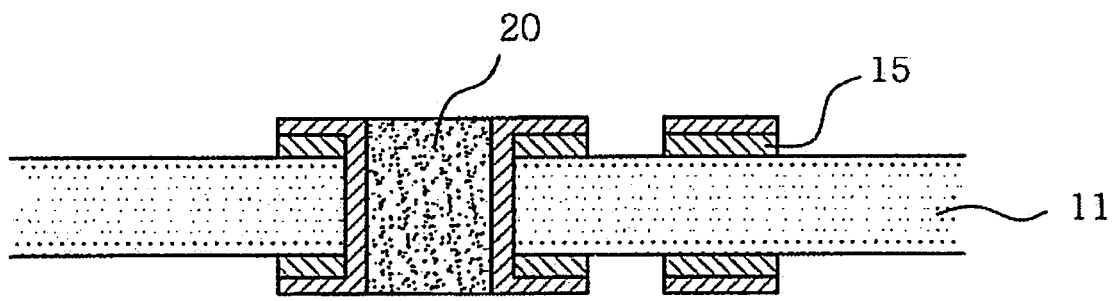
Figure 1G:
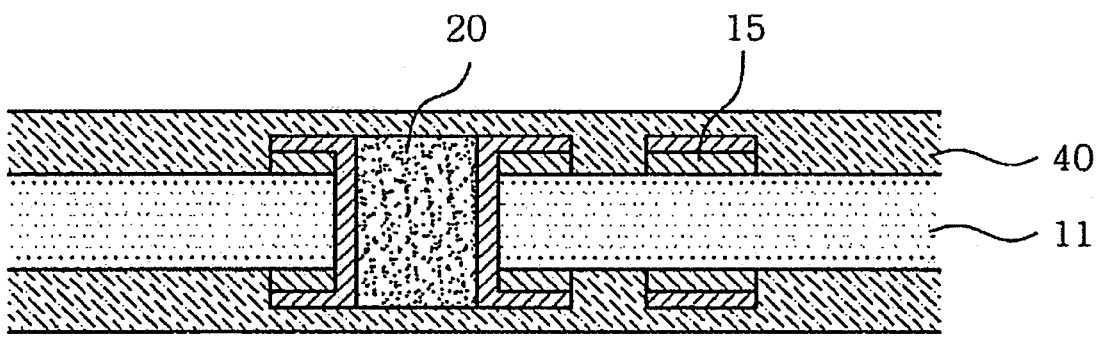
Figure 1H:
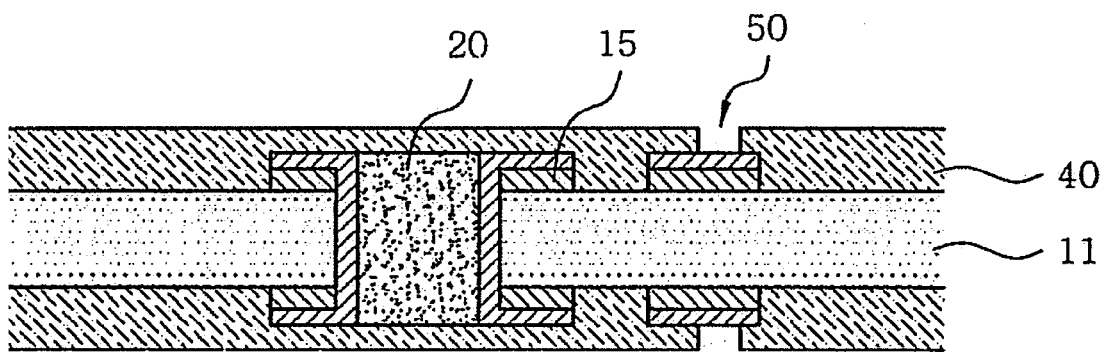
Figure 1I:
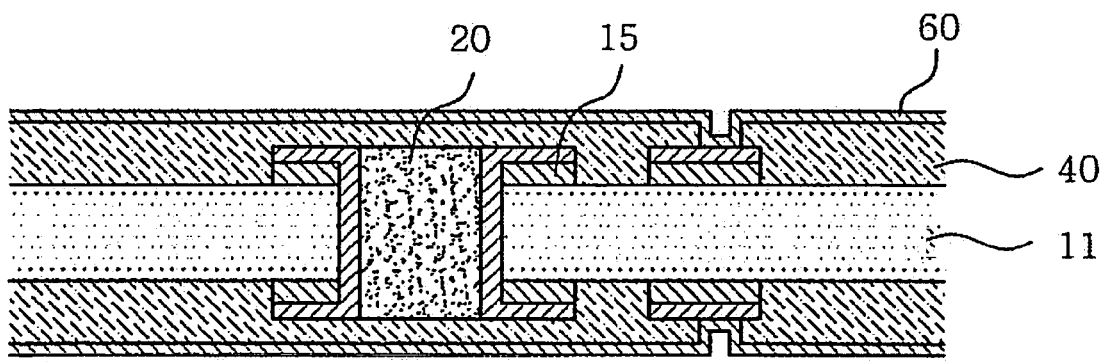
Figure 1J:
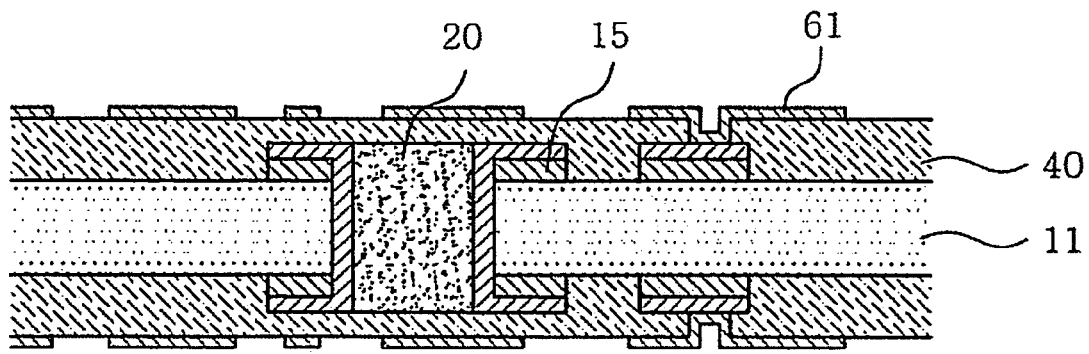
Figure 1K:
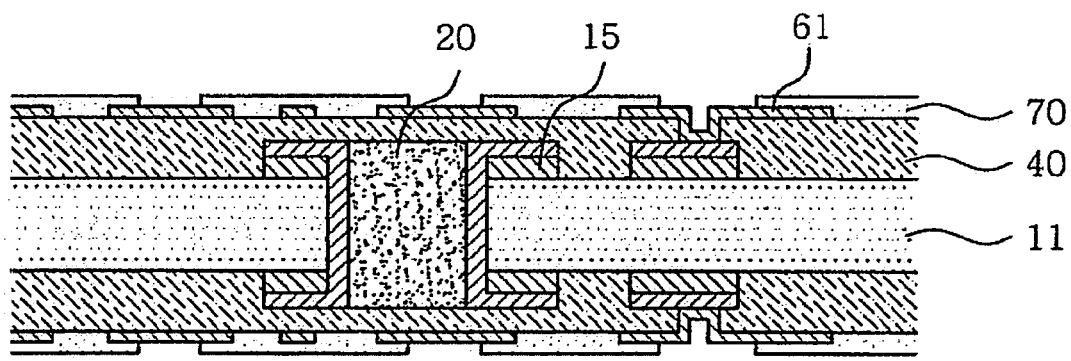
Figure 2A:
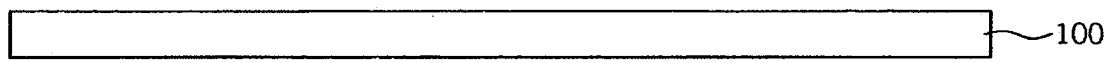
FIG. 2a to 2k are views to show a process of manufacturing a package substrate with a fine circuit pattern using anodizing oxidation, according to the first embodiment of the present invention.

First, as shown in FIG. 2a, a metal core 100, serving as a core of a coreless package substrate, is prepared.

In this case, the metal core 100 has a thickness of 0.2 mm to 1.0 mm, and is made of a metal, such as aluminum (Al), nickel (Ni), magnesium (Mg), titanium (Ti), zinc (Zn), or tantalum (Ta).

After the metal core 100 is provided, a masking process is carried out to form open areas on the metal core 100. In the open areas, oxidation layers are grown using anodic oxidation.

Figure 2B:
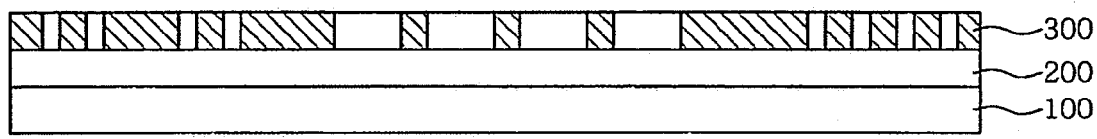

In a detailed description, a dry film 200 to be cured is layered on the metal core 100, and an artwork film 300 having a predetermined circuit pattern is aligned with the dry film 200, as shown in FIG. 2b.

Figure 2C:
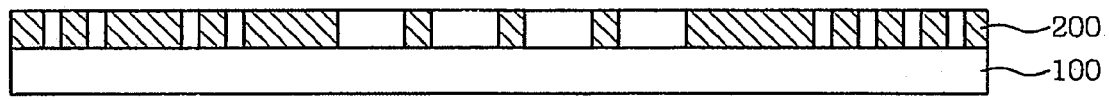
Figure 2D:
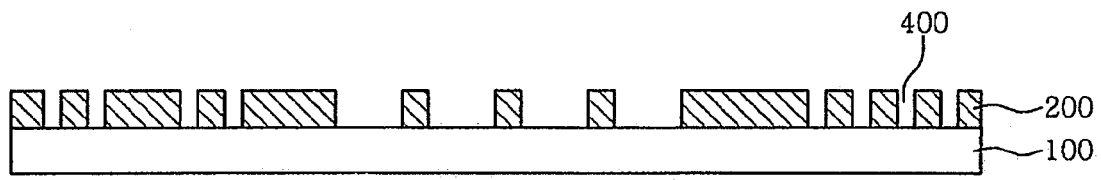

Subsequently, ultraviolet rays are irradiated through the artwork film 300 to the dry film 200, so that the dry film 200 is cured, except for portions corresponding to the open areas, as shown in FIG. 2c. Non-cured portions of the dry film 200 are etched, thus forming open areas 400 in which oxidation layers are grown, as shown in FIG. 2d.

After the open areas 400 in which the oxidation layers are grown are formed on the metal core 100, the oxidation layers 500, which insulate portions of the circuit pattern from each other, are grown in the open areas 400 by anodizing the metal core 100.

Figure 2E:
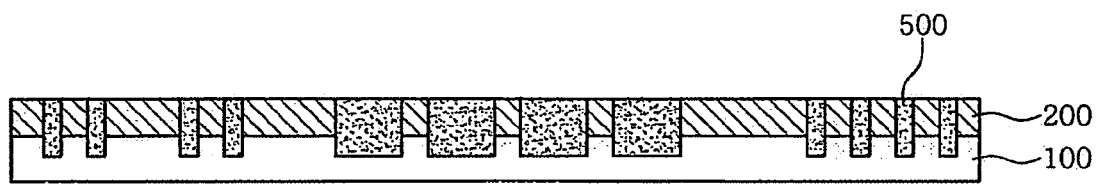

In a detailed description, the metal core 100 is soaked in an electrolyte, such as boric acid, phosphoric acid, sulfuric acid, or chromic acid. Next, an anode is applied to the metal core 100, while a cathode is applied to the electrolyte, so that the oxidation layers electrically insulating the circuit pattern, for example, $Al_2O_3$, are grown through the open areas 400 that are formed on a surface of the metal core 100, as shown in FIG. 2e. In this case, the oxidation layers $Al_2O_3$ are grown by oxidizing the aluminum core.

It is preferable that the oxidation layers 500 be grown to have a thickness of about 100 microns, considering the hardness and characteristics of hard anodized coating.

Figure 2F:
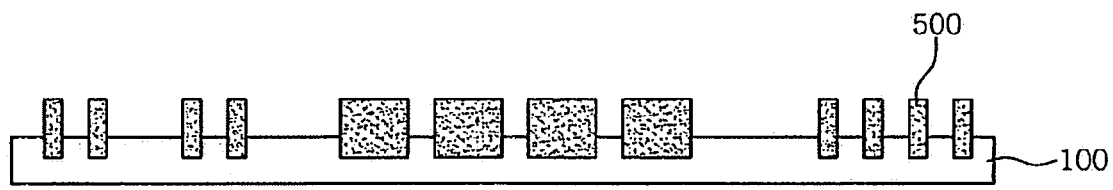

Next, as shown in FIG. 2f, the dry film 200 covering the metal core 100 except for the open areas 400 is stripped, so that the oxidation layers 500, electrically insulating portions of the circuit pattern formed on the metal core 100 from each other, are completed.

In this case, the oxidation layers 500 penetrate through a part of the metal core 100 by a predetermined depth to have a grooved shape, thus preventing delamination from occurring.

Further, the oxidation layers 500 also serve as a heat sink to dissipate heat generated in the final package substrate to the outside.

After the oxidation layers 500 are formed through the open areas 400 of the metal core 100, conductive layers are formed between the oxidation layers 500, thus providing a fine circuit pattern 600 having a predetermined shape.

Figure 2G:
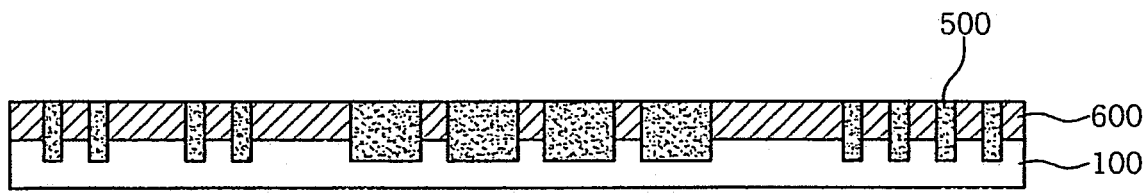

That is, portions provided between the oxidation layers 500 which are grown from a surface of the metal core 100 are electroplated with a conductive metal, such as copper, thus forming the conductive layers. Thereby, the fine circuit pattern, which has the predetermined shape and transmits an electric signal, is obtained, as shown in FIG. 2g.

Figure 2H:
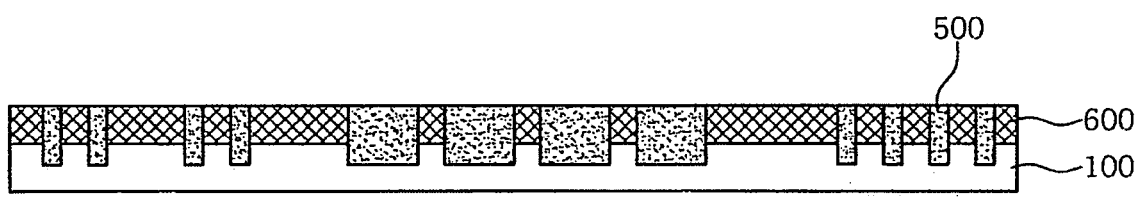

Alternatively, the fine circuit pattern 600 may be obtained from conductive layers which are formed by filling conductive paste between the oxidation layers 500 using a screen and drying the conductive paste, as shown in FIG. 2h.

Figure 2I:
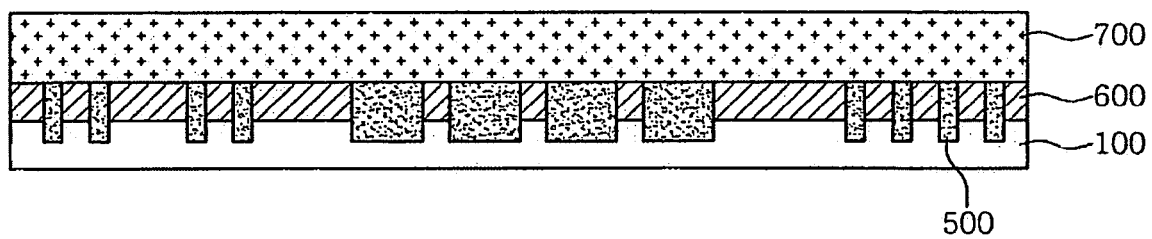

After the fine circuit pattern 600 is formed on a surface of the metal core 100, a resin layer 700 is formed as shown in FIG. 2i. The resin layer 700 covers the fine circuit pattern 600 formed on a surface of the metal core 100, thus protecting the fine circuit pattern from an external environment.

In this case, the resin layer 700 is usually made of an epoxy resin which is produced through polymerization of epoxy groups and is a kind of a thermosetting resin. The epoxy resin has a specific gravity of 1.230 to 1.189, and is superior in mechanical characteristics, for example, bending strength and hardness. Further, even when the epoxy resin is cured, volatile substances are not produced and the epoxy resin does not contract.

As such, after the resin layer 700 is formed to cover the fine circuit pattern 600 formed on a surface of the metal core 100, an opposite surface of the metal core 100 is selectively etched. Thereby, the final base substrate for packaging is accomplished, as shown in FIGS. 2j and 2k.

Figure 2J:
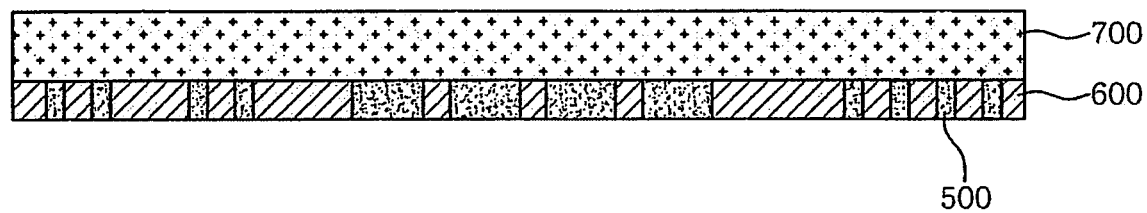
Figure 2K:
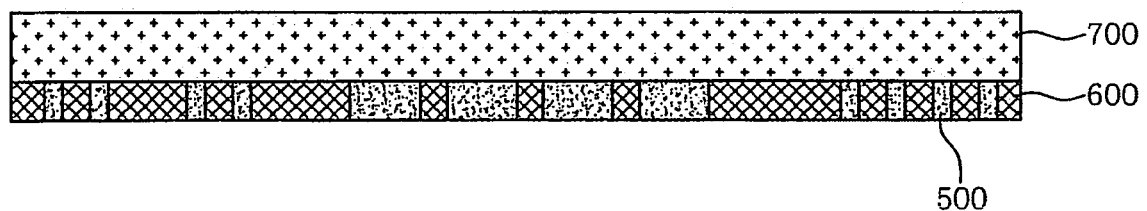

In this case, FIG. 2j is a sectional view to show a package substrate having a fine circuit pattern 600 which is obtained by electroplating portions between the oxidation layers 500 with the conductive metal, such as copper. FIG. 2k is a sectional view to show a package substrate having a fine circuit pattern 600 which is obtained by filling the conductive paste between the oxidation layers 500 using the screen and drying the conductive paste.

Hereinafter, a method of manufacturing a package substrate with a fine circuit pattern using anodic oxidation, according to the second embodiment of this invention, will be described with reference to FIGS. 3a to 3l.

Figure 3A:
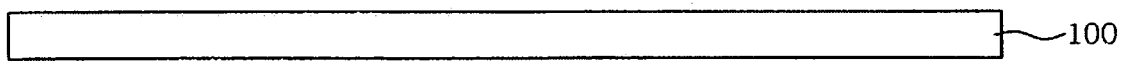
FIGS. 3a to 3l are views to show a process of manufacturing a package substrate with a fine circuit pattern using anodizing oxidation, according to the second embodiment of the present invention.

First, as shown in FIG. 3a, a metal core 100, serving as a core of a coreless package substrate, is prepared. The metal core 100 is made of a metal, such as aluminum (Al), nickel (Ni), magnesium (Mg), titanium (Ti), zinc (Zn), or tantalum (Ta).

After the metal core 100 is provided, a masking process is carried out to form open areas on the metal core 100. In the open areas, oxidation layers are grown using anodic oxidation.

Figure 3B:
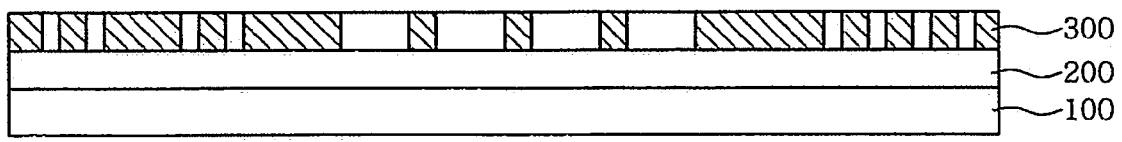

In a detailed description, a dry film 200 to be cured is covered on the metal core 100, and an artwork film 300 having a predetermined circuit pattern is aligned with the dry film 200, as shown in FIG. 3b.

Figure 3C:
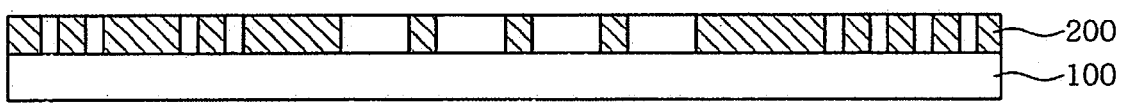
Figure 3D:
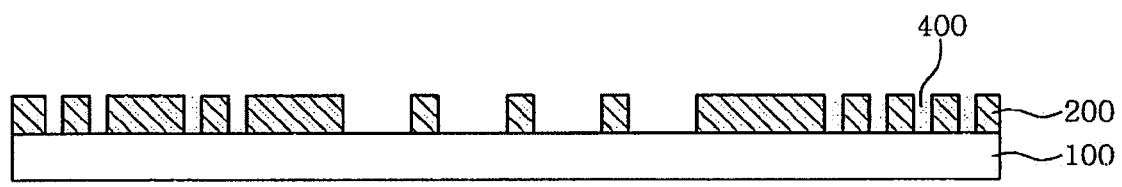

Subsequently, ultraviolet rays are irradiated through the artwork film 300 to the dry film 200, so that the dry film 200 is cured, except for portions corresponding to the open areas, as shown in FIG. 3c. Non-cured portions of the dry film 200 are etched, thus forming open areas 400 in which oxidation layers are grown, as shown in FIG. 3d.

Figure 3E:
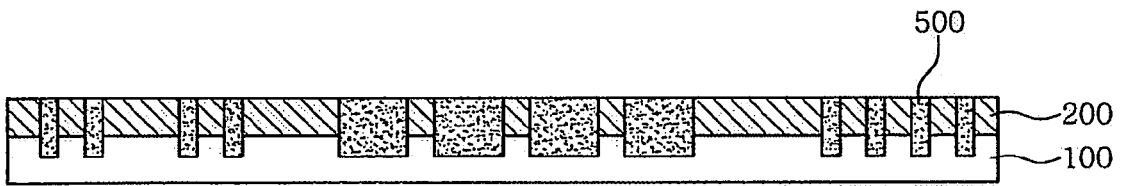
Figure 3F:
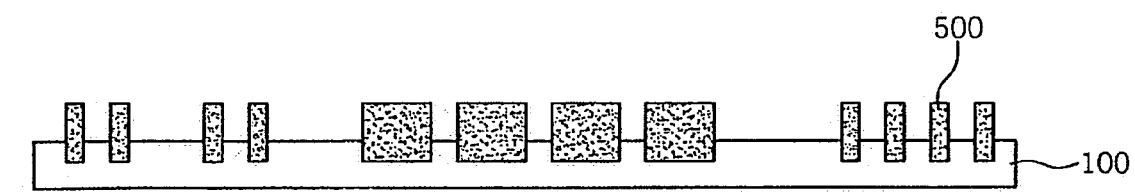

After the open areas 400 in which the oxidation layers are grown are formed on the metal core 100, as shown in FIG. 3e, the oxidation layers 500 are grown through the open areas 400 by anodizing the metal core 100. Next, as shown in FIG. 3f, the dry film 200 covering the metal core 100 except for the open areas 400 is stripped, so that oxidation layers 500, electrically insulating portions of the circuit pattern from each other, are completed.

In this case, it is preferable that the oxidation layers 500 be grown through the open areas to have a thickness of about 20 to 100 microns, considering the hardness and characteristics of hard anodized coating.

After the oxidation layers 500 are formed through the open areas 400 of the metal core 100, conductive layers are formed between the oxidation layers 500, thus providing a fine circuit pattern having a predetermined shape.

Figure 3G:
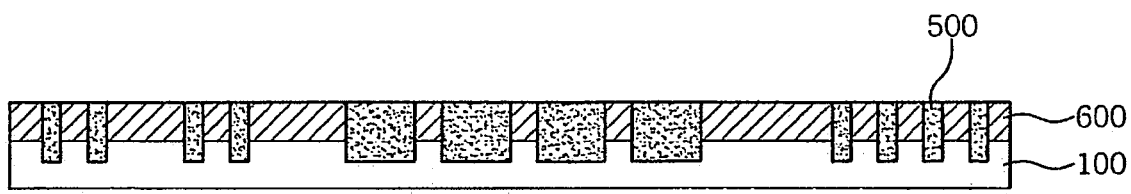

That is, portions provided between the oxidation layers 500 grown from a surface of the metal core 100 are electroplated with a conductive metal, such as copper, thus forming the conductive layers. Thereby, the fine circuit pattern, which has the predetermined shape and transmits an electric signal, is obtained, as shown in FIG. 3g.

Figure 3H:
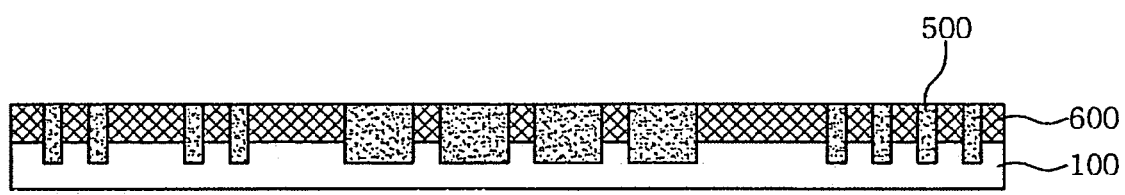

Alternatively, the fine circuit pattern 600 may be obtained from conductive layers which are formed by filling conductive paste between the oxidation layers 500 using a screen and drying the conductive paste, as shown in FIG. 3h.

Figure 3I:
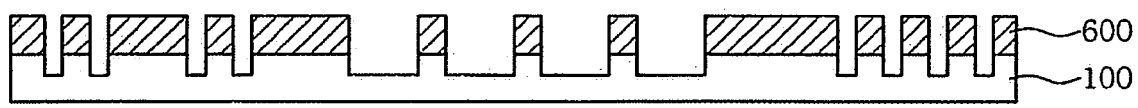
Figure 3J:
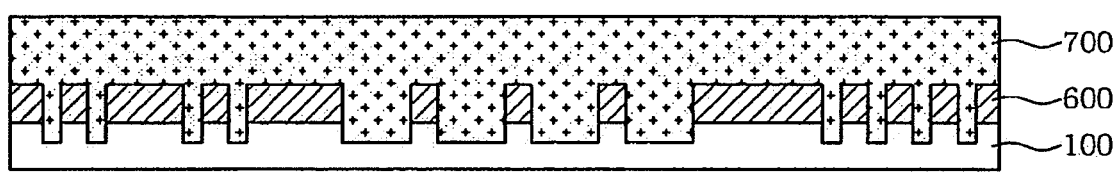

After the fine circuit pattern 600 is formed on a surface of the metal core 100, the oxidation layers are selectively etched and eliminated through a masking process, as shown in FIG. 3i. Next, a resin layer 700 is formed to protect the fine circuit pattern 600 formed on a surface of the metal core 100, as shown in FIG. 3j.

Subsequently, an opposite surface of the metal core 100 is selectively etched. Thereby, the final base substrate for packaging is accomplished, as shown in FIGS. 3k and 3l.

Figure 3K:
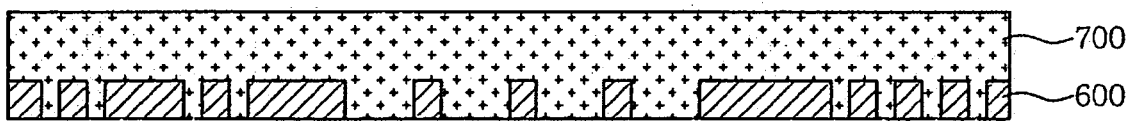
Figure 3L:
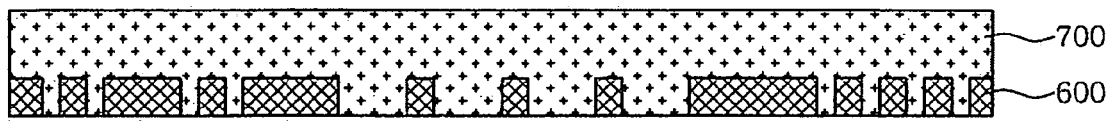

In this case, FIG. 3k is a sectional view to show a package substrate with the fine circuit pattern 600 which is obtained by electroplating portions between the oxidation layers 500 with the conductive metal, such as copper. FIG. 3l is a sectional view to show a package substrate with the fine circuit pattern 600 which is obtained by filling the conductive paste between the oxidation layers 500 using the screen and drying the conductive paste.

Meanwhile, a method of manufacturing a package substrate with a fine circuit pattern using anodic oxidation, according to the third embodiment of this invention, will be described below with reference to FIGS. 4a to 4k.

Figure 4A:
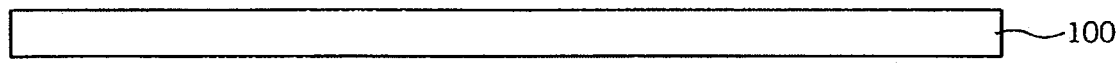
FIGS. 4a to 4k are views to show a process of manufacturing a package substrate with a fine circuit pattern using anodizing oxidation, according to the third embodiment of the present invention.

First, as shown in FIG. 4a, a metal core 100, serving as a core of a coreless package substrate, is prepared. The metal core 100 is made of a metal, such as aluminum (Al), nickel (Ni), magnesium (Mg), titanium (Ti), zinc (Zn), or tantalum (Ta).

After the metal core 100 is provided, a masking process is carried out to form open areas on the metal core 100. In the open areas, oxidation layers are grown using anodic oxidation.

Figure 4B:
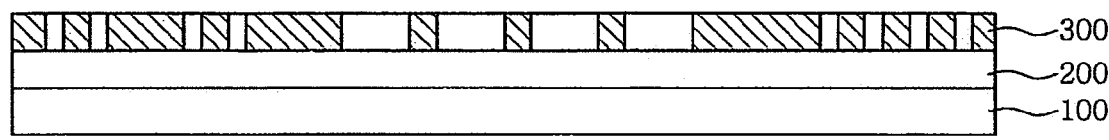

In a detailed description, a dry film 200 to be cured is layered on the metal core 100, and an artwork film 300 having a predetermined circuit pattern is aligned with the dry film 200, as shown in FIG. 4b.

Figure 4C:
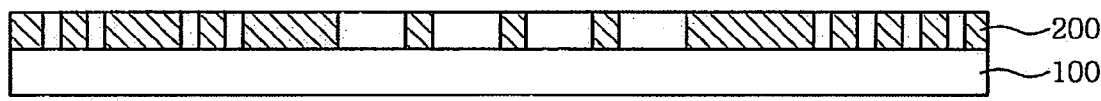
Figure 4D:
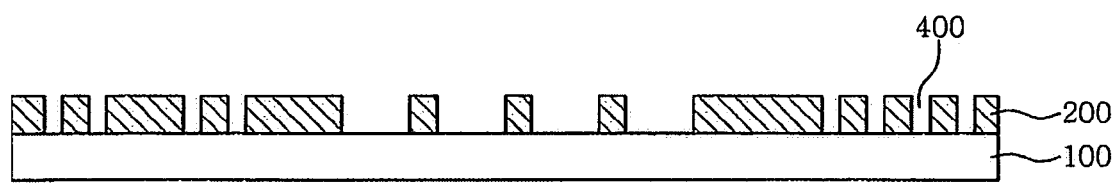

Subsequently, ultraviolet rays are irradiated through the artwork film 300 to the dry film 200, so that the dry film 200 is cured, except for portions corresponding to the open areas, as shown in FIG. 4c. Non-cured portions of the dry film 200 are etched, thus forming open areas 400 in which oxidation layers are grown, as shown in FIG. 4d.

Figure 4E:
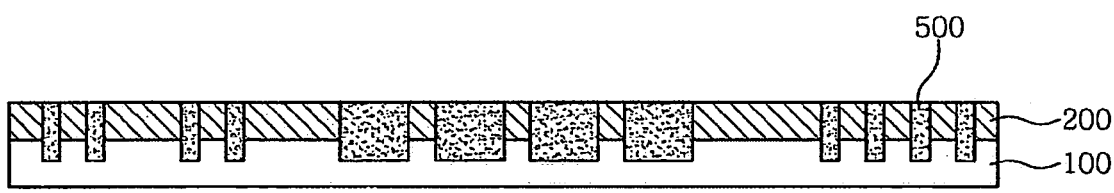
Figure 4F:
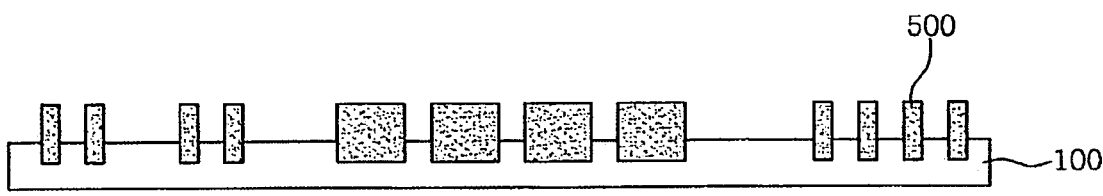

After the open areas 400 in which the oxidation layers are grown are formed on the metal core 100, the oxidation layers 500 are grown in the open areas 400 by anodizing the metal core 100, as shown in FIG. 4e. Next, as shown in FIG. 4f, the dry film 200 covering the metal core 100 other than the open areas 400 is stripped, so that oxidation layers 500, electrically insulating portions of the circuit pattern from each other, are completed.

In this case, it is preferable that the oxidation layers 500 be grown through the open areas to have a thickness of about 20 to 100 microns, considering the hardness and characteristics of hard anodized coating.

Figure 4G:
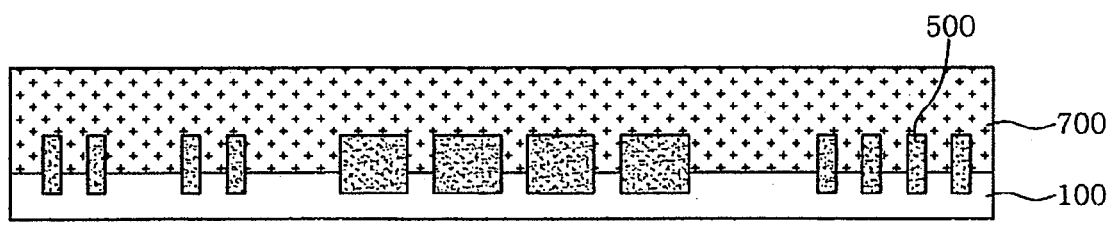

After the oxidation layers 500 are formed through the open areas of the metal core 100, a resin layer 700 is formed to protect a fine circuit pattern 600 formed on a surface of the metal core 100 from the external environment, as shown in FIG. 4g.

Figure 4H:

Thereafter, an opposite surface of the metal core 100 is selectively etched and eliminated, as shown in FIG. 4h.

Figure 4I:
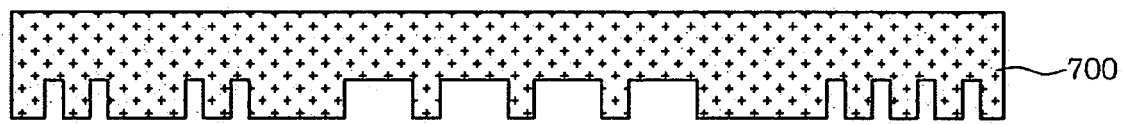

After the metal core 100 is selectively etched, the oxidation layers 500 are selectively etched and eliminated through a masking process, as shown in FIG. 4i.

Thereafter, conductive layers are formed in portions left after selectively etching the oxidation layers 500, so that the package substrate with the fine circuit pattern 600 having a predetermined shape is manufactured.

Figure 4J:
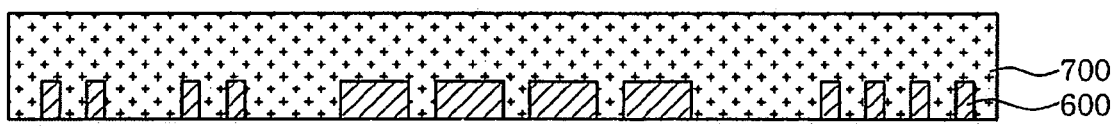

In this case, as shown in FIG. 4j, the fine circuit pattern 600 is achieved by the conductive layers that are formed by electroplating the portions left after selectively etching the oxidation layers 500 with a conductive metal such as copper.

Figure 4K:
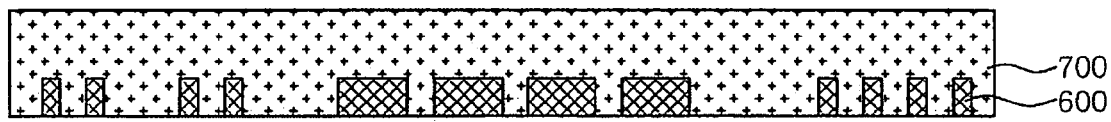

Alternatively, the fine circuit pattern 600 may be obtained from the conductive layers that are formed by filling conductive paste in the portions left after selectively etching the oxidation layers 500, using a screen, and then drying the conductive paste, as shown in FIG. 4k.

In this case, FIG. 4j is a sectional view to show a package substrate with the fine circuit pattern 600 which is obtained by electroplating the portions left after selectively etching the oxidation layers 500 with the conductive metal, such as copper. FIG. 4k is a sectional view to show a package substrate with the fine circuit pattern 600 which is obtained by filling the conductive paste in the portions left after selectively etching the oxidation layers 500, using the screen and then drying the conductive paste.

Furthermore, a method of manufacturing a package substrate with a fine circuit pattern using anodic oxidation, according to the fourth embodiment of this invention, will be described with reference to FIGS. 5a to 5r.

Figure 5A:
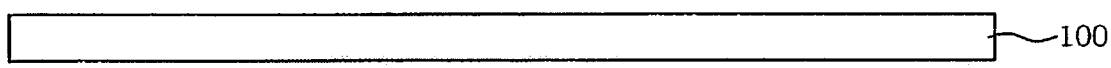
FIGS. 5a to 5r are views to show a process of manufacturing a package substrate with a fine circuit pattern using anodizing oxidation, according to the fourth embodiment of the present invention.

First, as shown in FIG. 5a, a metal core 100, serving as a core of a coreless package substrate, is prepared. The metal core 100 is made of a metal, such as aluminum (Al), nickel (Ni), magnesium (Mg), titanium (Ti), zinc (Zn), or tantalum (Ta).

After the metal core 100 is provided, a masking process is carried out to form open areas on the metal core 100. In the open areas, oxidation layers are grown using anodic oxidation.

Figure 5B:
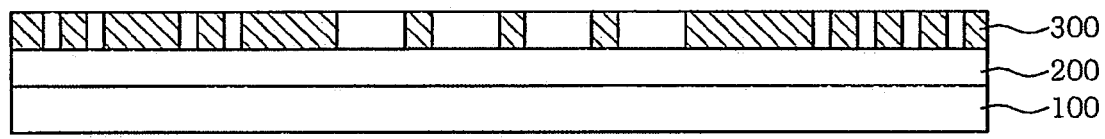

In a detailed description, a dry film 200 to be cured is layered on the metal core 100, and an artwork film 300 having a predetermined circuit pattern is aligned with the dry film 200, as shown in FIG. 5b.

Figure 5C:
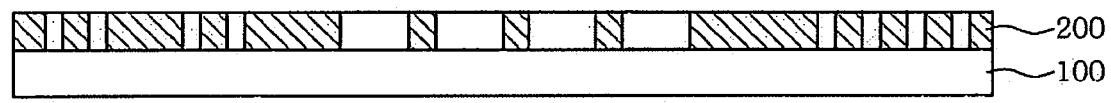
Figure 5D:
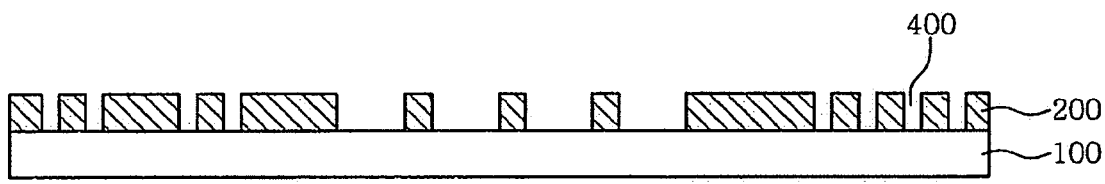

Subsequently, ultraviolet rays are irradiated through the artwork film 300 to the dry film 200, so that the dry film 200 is cured, except for portions corresponding to the open areas, as shown in FIG. 5c. Non-cured portions of the dry film 200 are etched, thus forming open areas 400 on which oxidation layers are grown, as shown in FIG. 5d.

Figure 5E:
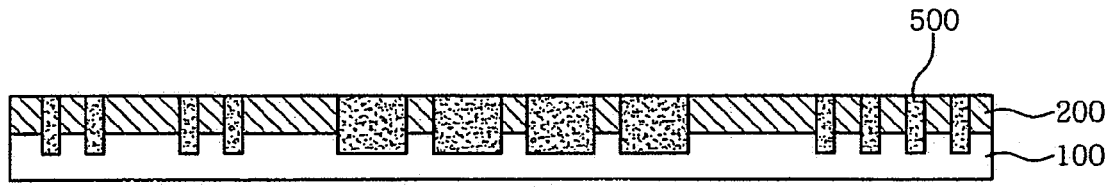
Figure 5F:
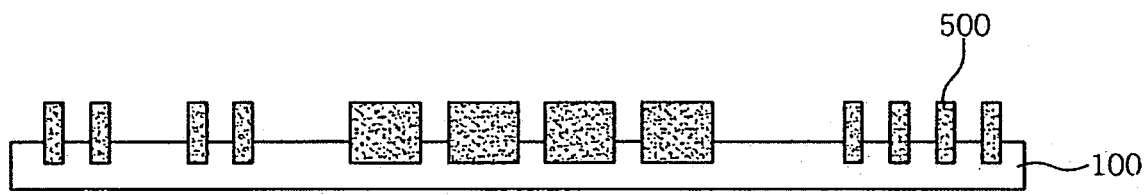

After the open areas 400 in which the oxidation layers are grown are formed on the metal core 100, the oxidation layers 500 are grown through the open areas 400 by anodizing the metal core 100, as shown in FIG. 5e. Next, as shown in FIG. 5f, the dry film 200 covering the metal core 100 other than the open areas 400 is stripped, so that oxidation layers 500, electrically insulating portions of the circuit pattern from each other, are completed.

In this case, it is preferable that the oxidation layers 500 be grown through the open areas 400 to have a thickness of about 20 to 100 microns, considering the hardness and characteristics of hard anodized coating.

After the oxidation layers 500 are formed through the open areas 400 of the metal core 100, conductive layers are formed between the oxidation layers 500, thus providing a fine circuit pattern having a predetermined shape.

Figure 5G:
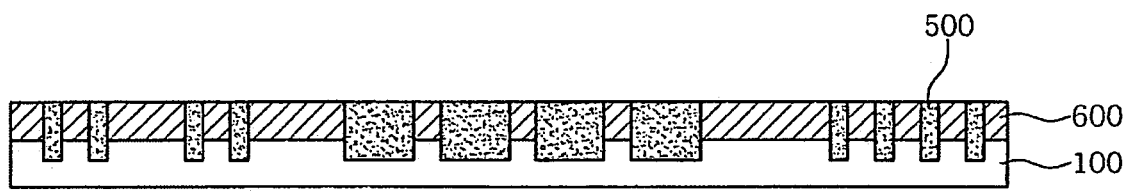

That is, portions provided between the oxidation layers 500 which are grown from a surface of the metal core 100 are electroplated with a conductive metal, such as copper, thus forming the conductive layers. Thereby, the fine circuit pattern, which has the predetermined shape and transmits an electric signal, is obtained, as shown in FIG. 5g.

Figure 5H:

Alternatively, the fine circuit pattern 600 may be obtained from conductive layers which are formed by filling conductive paste between the oxidation layers 500 using a screen and drying the conductive paste, as shown in FIG. 5h.

After the fine circuit pattern 600 is formed on a surface of the metal core 100, plating posts are formed on the surface of the metal core 100 with the fine circuit pattern 600. The plating posts provide an interlayer electrical connection.

For easy understanding of this invention, a process of forming the plating posts will be described below with reference to the process of manufacturing the package substrate with the fine circuit pattern through electroplating.

Figure 5I:
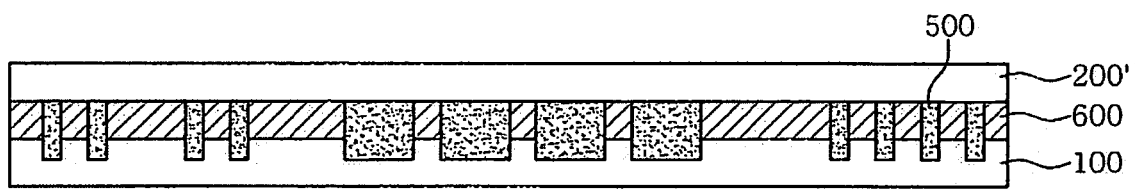
Figure 5J:
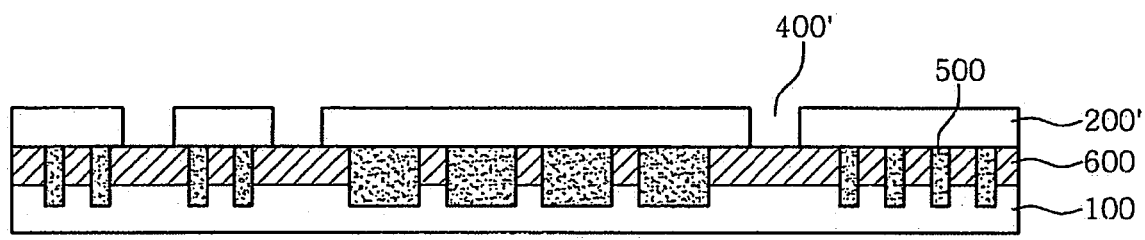

First, a dry film 200' to be cured is covered on a surface of the metal core 100 with the fine circuit pattern 600, as shown in FIG. 5i. Ultraviolet rays are irradiated through the artwork film to the dry film 200' to cure the dry film 200', thus forming open areas 400' on which the plating posts are formed, as shown in FIG. 5j.

Figure 5K:
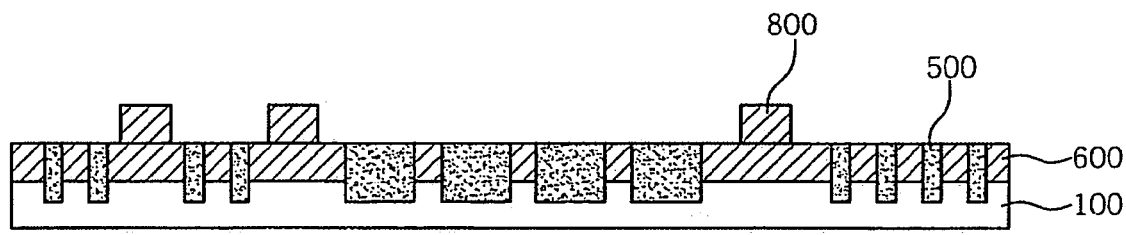

Next, the open areas 400' are electro-copper plated, thus forming conductive layers. The dry film 200' is stripped, except for portions where the plating posts are formed. Thereafter, plating posts 800 are provided on predetermined positions to transmit an electric signal between layers, as shown in FIG. 5k.

In this case, the plating posts 800 may be obtained by filling conductive paste in the open areas 400' using a screen and drying the conductive paste.

Figure 5L:
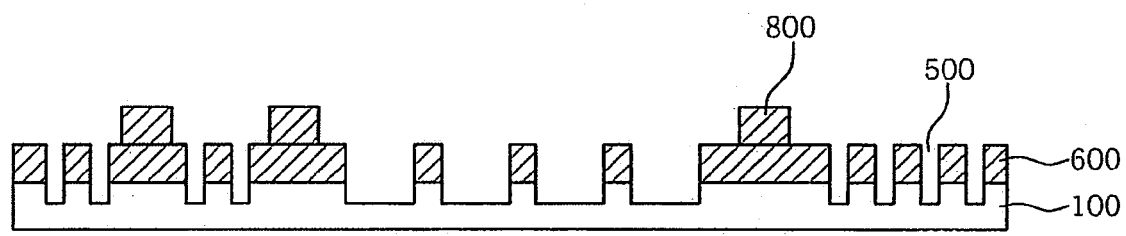

Further, an oxidation layer removal process may be added, as shown in FIG. 5*l*. This process is performed by selectively etching the oxidation layers 500 which electrically insulate portions of the fine circuit pattern 600 from each other through a masking process.

Figure 5M:
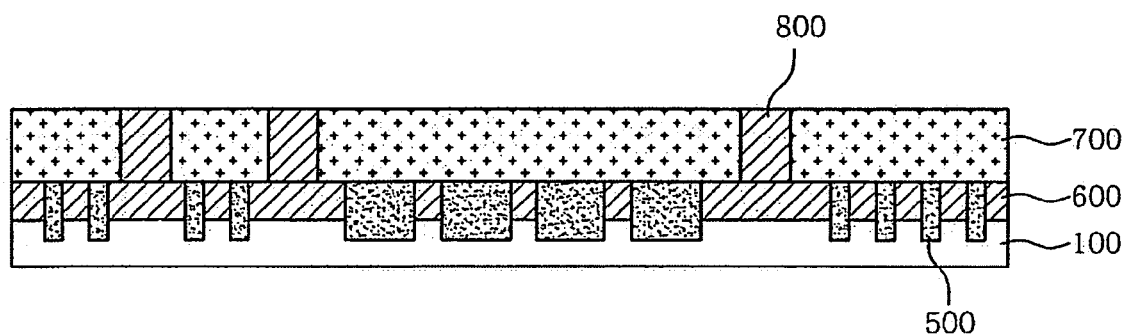

After the plating posts 800 having the electric connecting function are formed, a resin layer 700 is provided to cover the fine circuit pattern 600 formed on a surface of the metal core 100, thus protecting the fine circuit pattern 600 from the external environment, as shown in FIG. 5*m*.

Figure 5N:
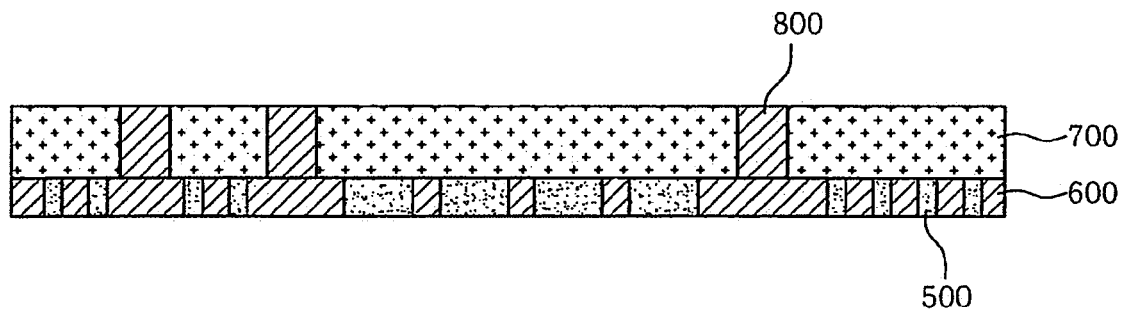

Next, an opposite surface of the metal core 100 is selectively etched, so that a base substrate for packaging, without the metal core 100, is manufactured, as shown in FIG. 5*n*. Many base substrates are superposed on each other such that the plating posts 800 providing the interlayer electrical connection are aligned with each other. In such a state, the substrates are compressed, thus manufacturing a multi-layer base substrate for packaging, as shown in FIGS. 5*o* to 5*r*.

Figure 5O:
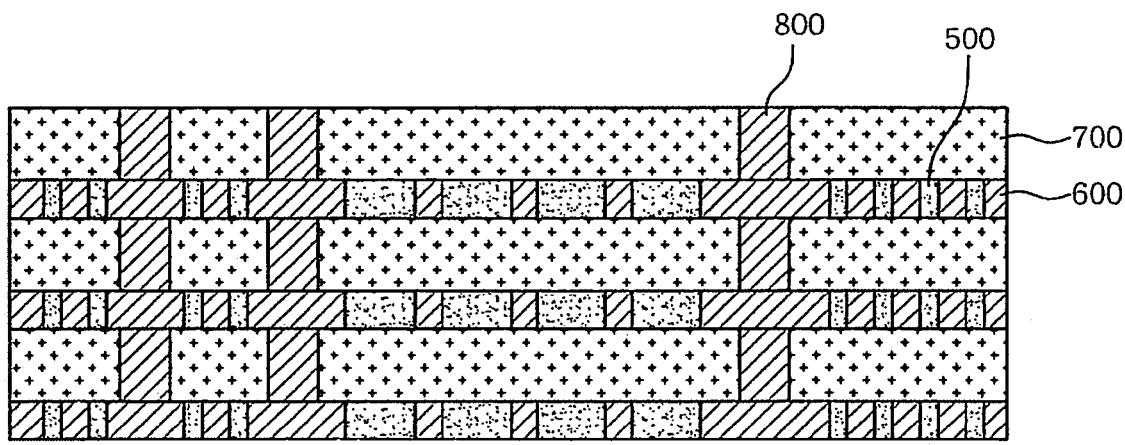
Figure 5P:
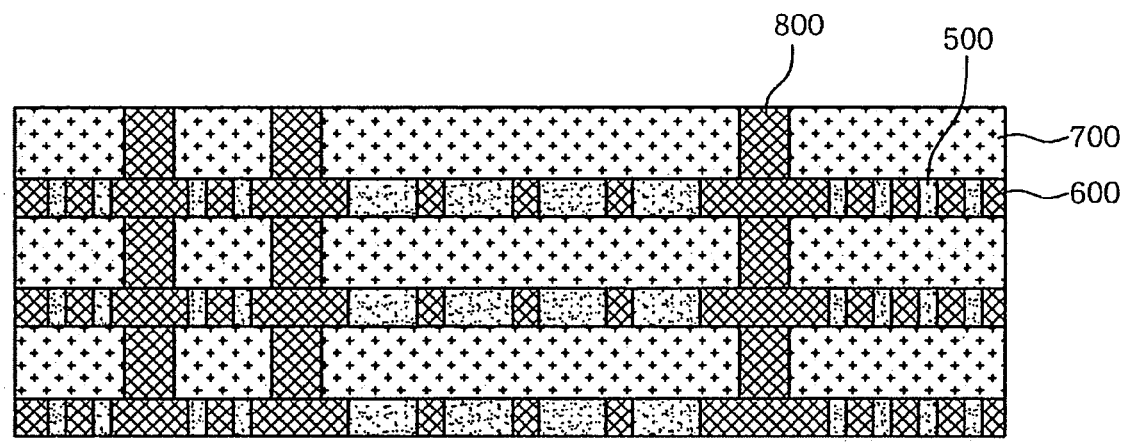

In this case, FIG. 5*o* is a sectional view of the multi-layer package substrate which is fabricated by laminating base substrates having the fine circuit pattern 600 and the plating posts 800 that are formed through electroplating. FIG. 5*p* is a sectional view of the multi-layer package substrate which is fabricated by laminating base substrates having the fine circuit pattern 600 and the plating posts 800 that are formed through a screen printing method.

Figure 5Q:
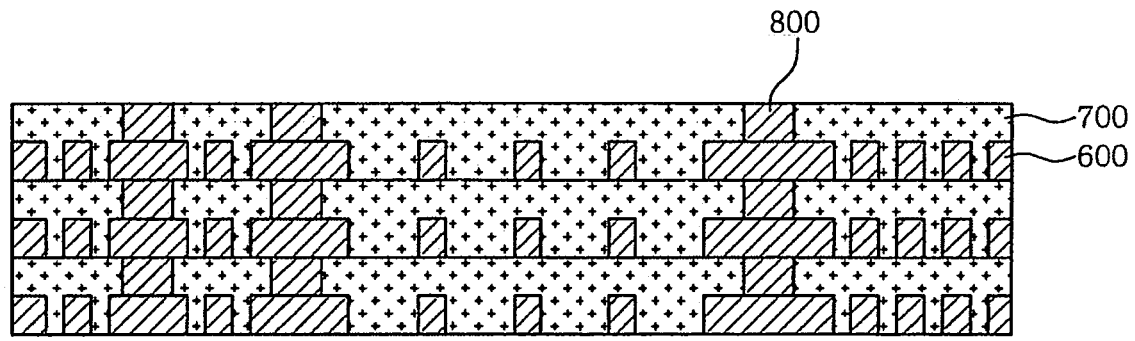
Figure 5R:
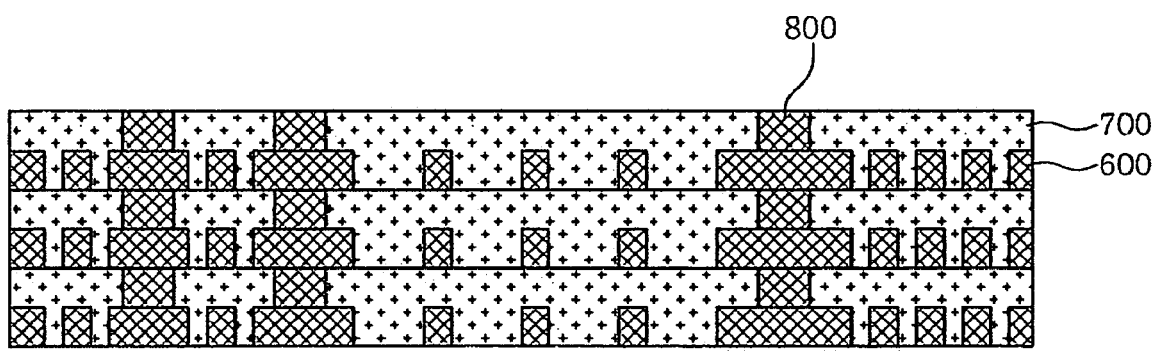

Further, FIG. 5*q* is a sectional view of the multi-layer package substrate which is fabricated by laminating the base substrates having the fine circuit pattern 600 and the plating posts 800 that are formed by electroplating portions which are eliminated by selectively etching the oxidation layers 500. FIG. 5*r* is a sectional view of the multi-layer package substrate which is fabricated by laminating the base substrates having the fine circuit pattern 600 and the plating posts 800 that are formed by processing portions which are eliminated by selectively etching the oxidation layers 500, through the screen printing method.

As described above, the present invention provides a method of manufacturing a package substrate with a fine circuit pattern using anodic oxidation, which forms oxidation layers by anodizing open areas of a metal core, and achieves a fine circuit pattern by electroplating portions provided between the oxidation layers or filling paste in portions provided between the oxidation layers, thus enabling more fine circuit to be applied to existing equipment, and preventing delamination from occurring.

Further, the present invention provides a coreless package substrate, thus accomplishing lightness, thinness, compactness, smallness, and multi-functionality of the package substrate, and enhancing integration of a system, therefore accomplishing system-in-packaging.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a package substrate, comprising:
   forming open areas on a surface of a metal core through a masking process;
   growing oxidation layers through the open areas by anodizing the metal core;
   forming a fine circuit pattern by forming conductive layers between the oxidation layers provided on the surface of the metal core;
   forming a resin layer on the surface of the metal core with the fine circuit pattern; and
   selectively etching an opposite surface of the metal core.

2. The method as set forth in claim 1, wherein the formation of the open areas on the surface of the metal core comprises:
   layering a dry film to be cured on the surface of the metal core;
   aligning an artwork film with the dry film, the artwork film having a circuit pattern to form the open areas on the dry film;
   curing the dry film by irradiating ultraviolet rays through the artwork film to the dry film; and
   forming the open areas in which the oxidation layers are grown, by etching non-cured portions of the dry film covering the open areas.

3. The method as set forth in claim 1, wherein the metal core comprises a metal selected from the group consisting of aluminum, nickel, magnesium, titanium, zinc, and tantalum.

4. The method as set forth in claim 1, wherein the oxidation layers are formed to penetrate the metal core by a predetermined depth, thus creating a grooved shape.

5. The method as set forth in claim 1, wherein the fine circuit pattern is formed by electroplating portions provided between the oxidation layers with a conductive metal.

6. The method as set forth in claim 5, wherein the conductive metal is copper.

7. The method as set forth in claim 1, wherein the fine circuit pattern is formed by filling conductive paste between the oxidation layers using a screen, and drying the conductive paste.

8. A method of manufacturing a package substrate, comprising:
   forming open areas on a surface of a metal core through a masking process;
   growing oxidation layers through the open areas by anodizing the metal core;
   forming a fine circuit pattern by forming conductive layers between the oxidation layers provided on the surface of the metal core;
   selectively etching the oxidation layers through a masking process;
   forming a resin layer on the surface of the metal core with the fine circuit pattern; and
   selectively etching an opposite surface of the metal core, thus providing a base substrate for packaging.

9. The method as set forth in claim 8, wherein the formation of the open areas on the surface of the metal core comprises:
   layering a dry film to be cured on the surface of the metal core;
   aligning an artwork film with the dry film, the artwork film having a circuit pattern to form the open areas on the dry film;
   curing the dry film by irradiating ultraviolet rays through the artwork film to the dry film; and
   forming open areas in which the oxidation layers are grown, by etching non-cured parts of the dry film covering the open areas.

10. The method as set forth in claim 8, wherein the metal core comprises a metal selected from the group consisting of aluminum, nickel, magnesium, titanium, zinc, and tantalum.

11. The method as set forth in claim 8, wherein the oxidation layers are formed to penetrate the metal core by a predetermined depth, thus creating a grooved shape.

12. The method as set forth in claim 8, wherein the fine circuit pattern is formed by electroplating portions provided between the oxidation layers with a conductive metal.

13. The method as set forth in claim 12, wherein the conductive metal is copper.

14. The method as set forth in claim 8, wherein the fine circuit pattern is formed by filling conductive paste between the oxidation layers using a screen, and drying the conductive paste.

15. A method of manufacturing a package substrate, comprising:
forming open areas on a surface of a metal core through a masking process;
growing oxidation layers through the open areas by anodizing the metal core;
forming a resin layer on the surface of the metal core with the oxidation layers;
selectively etching an opposite surface of the metal core;
selectively etching the oxidation layers through a masking process; and
forming conductive layers in portions left after selectively etching the oxidation layers, thus providing a base substrate for packaging with a fine circuit pattern.

16. The method as set forth in claim 15, wherein the formation of the open areas on the surface of the metal core comprises:
layering a dry film to be cured on the surface of the metal core;
aligning an artwork film with the dry film, the artwork film having a circuit pattern to form the open areas on the dry film;
curing the dry film by irradiating ultraviolet rays through the artwork film to the dry film; and
forming the open areas in which the oxidation layers are grown, by etching non-cured parts of the dry film covering the open areas.

17. The method as set forth in claim 15, wherein the metal core comprises a metal selected from the group consisting of aluminum, nickel, magnesium, titanium, zinc, and tantalum.

18. The method as set forth in claim 15, wherein the oxidation layers are formed to penetrate the metal core by a predetermined depth, thus creating a grooved shape.

19. The method as set forth in claim 15, wherein the fine circuit pattern is formed by electroplating portions provided between the oxidation layers with a conductive metal.

20. The method as set forth in claim 19, wherein the conductive metal is copper.

21. The method as set forth in claim 15, wherein the fine circuit pattern is formed by filling conductive paste between the oxidation layers using a screen, and drying the conductive paste.

22. A method of manufacturing a package substrate, comprising:
forming open areas on a surface of a metal core through a masking process;
growing oxidation layers through the open areas by anodizing the metal core;
forming a fine circuit pattern by forming conductive layers between the oxidation layers provided on the surface of the metal core;
forming plating posts on the surface of the metal core with the circuit pattern, the plating posts providing an interlayer electrical connection;
forming a resin layer on the surface of the metal core with the plating posts;
selectively etching an opposite surface of the metal core, thus providing a base substrate for packaging; and
laminating and compressing several base substrates, thus providing a multi-layer base substrate for packaging.

23. The method as set forth in claim 22, further comprising:
selectively etching the oxidation layers through a masking process, after forming the plating posts.

24. The method as set forth in claim 22, wherein the formation of the open areas on the surface of the metal core comprises:
layering a dry film to be cured on the surface of the metal core;
aligning an artwork film with the dry film, the artwork film having a circuit pattern to form the open areas on the dry film;
curing the dry film by irradiating ultraviolet rays through the artwork film to the dry film; and
forming the open areas in which the oxidation layers are grown, by etching non-cured portions of the dry film covering the open areas.

25. The method as set forth in claim 22, wherein the metal core comprises a metal selected from the group consisting of aluminum, nickel, magnesium, titanium, zinc, and tantalum.

26. The method as set forth in claim 22, wherein the oxidation layers are formed to penetrate the metal core by a predetermined depth, thus creating a grooved shape.

27. The method as set forth in claim 22, wherein the fine circuit pattern is formed by electroplating portions provided between the oxidation layers with a conductive metal.

28. The method as set forth in claim 27, wherein the conductive metal is copper.

29. The method as set forth in claim 22, wherein the fine circuit pattern is formed by filling conductive paste between the oxidation layers using a screen, and drying the conductive paste.

30. The method as set forth in claim 22, wherein the formation of the plating posts for the interlayer electrical connection on the surface of the metal core comprises:
layering a dry film to be cured on the surface of the metal core with the fine circuit pattern;
aligning an artwork film with the dry film, the artwork film having a circuit pattern opened at areas where the plating posts are formed;
curing the dry film by irradiating ultraviolet rays through the artwork film to the dry film;
forming open areas for the plating posts by etching non-cured portions of the dry film covering the areas where the plating posts are formed; and
forming conductive layers on the open areas for the plating posts to provide the interlayer electrical connection.

31. The method as set forth in claim 30, wherein the conductive layers, which are formed in the open areas for the plating posts to provide the interlayer electrical connection, are formed through electroplating using a conductive metal.

32. The method as set forth in claim 31, wherein the conductive metal is copper.

33. The method as set forth in claim 30, wherein the conductive layers, which are formed in the open areas for the plating posts to provide the interlayer electrical connection, are formed by filling conductive paste using a screen and drying the conductive paste.

* * * * *